United States Patent
Liu et al.

(10) Patent No.: US 12,398,486 B2
(45) Date of Patent: Aug. 26, 2025

(54) METHOD AND SYSTEM FOR VERTICAL GRADIENT FREEZE 8 INCH GALLIUM ARSENIDE SUBSTRATES

(71) Applicant: AXT, Inc., Fremont, CA (US)

(72) Inventors: Weiguo Liu, San Leandro, CA (US); Rajaram Shetty, Niskayuna, NY (US); Wei Zhang, Fremont, CA (US)

(73) Assignee: AXT, INC., Fremont, CA (US)

( * ) Notice: Subject to any disclaimer, the term of this patent is extended or adjusted under 35 U.S.C. 154(b) by 0 days.

(21) Appl. No.: 18/463,949

(22) Filed: Sep. 8, 2023

(65) Prior Publication Data

US 2023/0416941 A1  Dec. 28, 2023

Related U.S. Application Data

(62) Division of application No. 17/700,746, filed on Mar. 22, 2022.

(60) Provisional application No. 63/164,378, filed on Mar. 22, 2021.

(51) Int. Cl.
  *C30B 11/00* (2006.01)
  *C30B 29/42* (2006.01)
  *H01L 21/02* (2006.01)

(52) U.S. Cl.
  CPC ............ *C30B 29/42* (2013.01); *C30B 11/002* (2013.01); *C30B 11/003* (2013.01); *C30B 11/006* (2013.01); *H01L 21/02395* (2013.01)

(58) Field of Classification Search
  CPC ... C30B 11/002; C30B 11/003; C30B 11/006; C30B 29/42; H01L 21/02395
  See application file for complete search history.

(56) References Cited

U.S. PATENT DOCUMENTS 4,999,082 A * 3/1991 Kremer .................. C30B 29/48
                                                                117/900
5,131,975 A * 7/1992 Bourret-Courchesne ....................
                                                                C30B 29/48
                                                                117/937

(Continued)

FOREIGN PATENT DOCUMENTS

CN    108060454 A  *  5/2018  ........... C30B 11/002
CN    111020689 A  *  4/2020  ............. C30B 11/00

(Continued)

OTHER PUBLICATIONS

European Patent Office, English computer translation of CN-108060454-A (Year: 2024).*

(Continued)

*Primary Examiner* — Matthew J Song
(74) *Attorney, Agent, or Firm* — McAndrews, Held & Malloy, Ltd.

(57) ABSTRACT

Methods and wafers for vertical gradient freeze 8 inch gallium arsenide (GaAs) substrates. In disclosed examples, vertical gradient freeze systems for forming gallium arsenide (GaAs) substrates having silicon as a dopant, the system includes a crucible to contain a GaAs liquid melt and seed material during a formation process; one or more heating coils arranged in a plurality of heating zones; and a pedestal to move relative to the crucible, the system operable to control heating of the plurality of heating zones and movement of the pedestal to form a single crystal GaAs substrate.

18 Claims, 11 Drawing Sheets

(56) References Cited

U.S. PATENT DOCUMENTS

| | | | | |
|---|---|---|---|---|
| 2003/0172870 A1* | 9/2003 | Liu | ........................ | C30B 29/40 |
| | | | | 117/200 |
| 2006/0260536 A1* | 11/2006 | Wachi | ..................... | C30B 29/42 |
| | | | | 117/13 |
| 2009/0249994 A1* | 10/2009 | Liu | ...................... | C30B 11/002 |
| | | | | 117/214 |
| 2011/0293890 A1* | 12/2011 | Liu | ........................ | C30B 11/00 |
| | | | | 117/3 |
| 2019/0085482 A1 | 3/2019 | Shindo | | |
| 2019/0264348 A1* | 8/2019 | Fukunaga | ............... | C30B 27/00 |
| 2020/0190697 A1 | 6/2020 | Shetty et al. | | |

FOREIGN PATENT DOCUMENTS

| | | | |
|---|---|---|---|
| JP | 2004-277266 A | 10/2004 |
| JP | 2006-001771 A | 1/2006 |
| JP | 2010-260747 A | 11/2010 |
| JP | 2013-507313 A | 3/2013 |

OTHER PUBLICATIONS

European Patent Office, English computer translation of CN-111020689-A (Year: 2024).*

Int'l Search Report and Written Opinion Appln No. PCT/US2022/021294 mailed Jul. 18, 2022.

Int'l Preliminary Report on Patentability Appln No. PCT/US2022/021294 issued Sep. 12, 2023.

Japanese Office Action Appln No. 2023-558436 dated Nov. 28, 2024.

* cited by examiner

METHOD AND SYSTEM FOR VERTICAL GRADIENT FREEZE 8 INCH GALLIUM ARSENIDE SUBSTRATES

CROSS-REFERENCE TO RELATED APPLICATIONS/INCORPORATION BY REFERENCE

This application is a Divisional of U.S. patent application Ser. No. 17/700,746 filed on Mar. 22, 2022, which claims priority to and the benefit of U.S. Provisional Application No. 63/164,378 filed on Mar. 22, 2021, which is hereby incorporated herein by reference in its entirety.

FIELD

Certain embodiments of the disclosure relate to semiconductor substrates. More specifically, certain embodiments of the disclosure relate to a method and system for vertical gradient freeze 8 inch gallium arsenide (GaAs) substrates.

BACKGROUND

Semiconductor substrates, and specifically Group III-V semiconductor substrates, are used in the manufacture of electronic and optoelectronic devices such as light-emitting diodes (LEDs), lasers, heterojunction bipolar transistors (HBTs), and pseudo-morphic high-electron mobility transistors (pHEMTs), for example. Defects in the substrates can reduce yields and increase costs.

Further limitations and disadvantages of conventional and traditional approaches will become apparent to one of skill in the art, through comparison of such systems with the present disclosure as set forth in the remainder of the present application with reference to the drawings.

BRIEF SUMMARY

A system and/or method for vertical gradient freeze 8 inch gallium arsenide (GaAs) substrates, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Certain aspects of the disclosure may be found in a method and system for vertical gradient freeze 8 inch gallium arsenide (GaAs) substrates.

Figure 1:
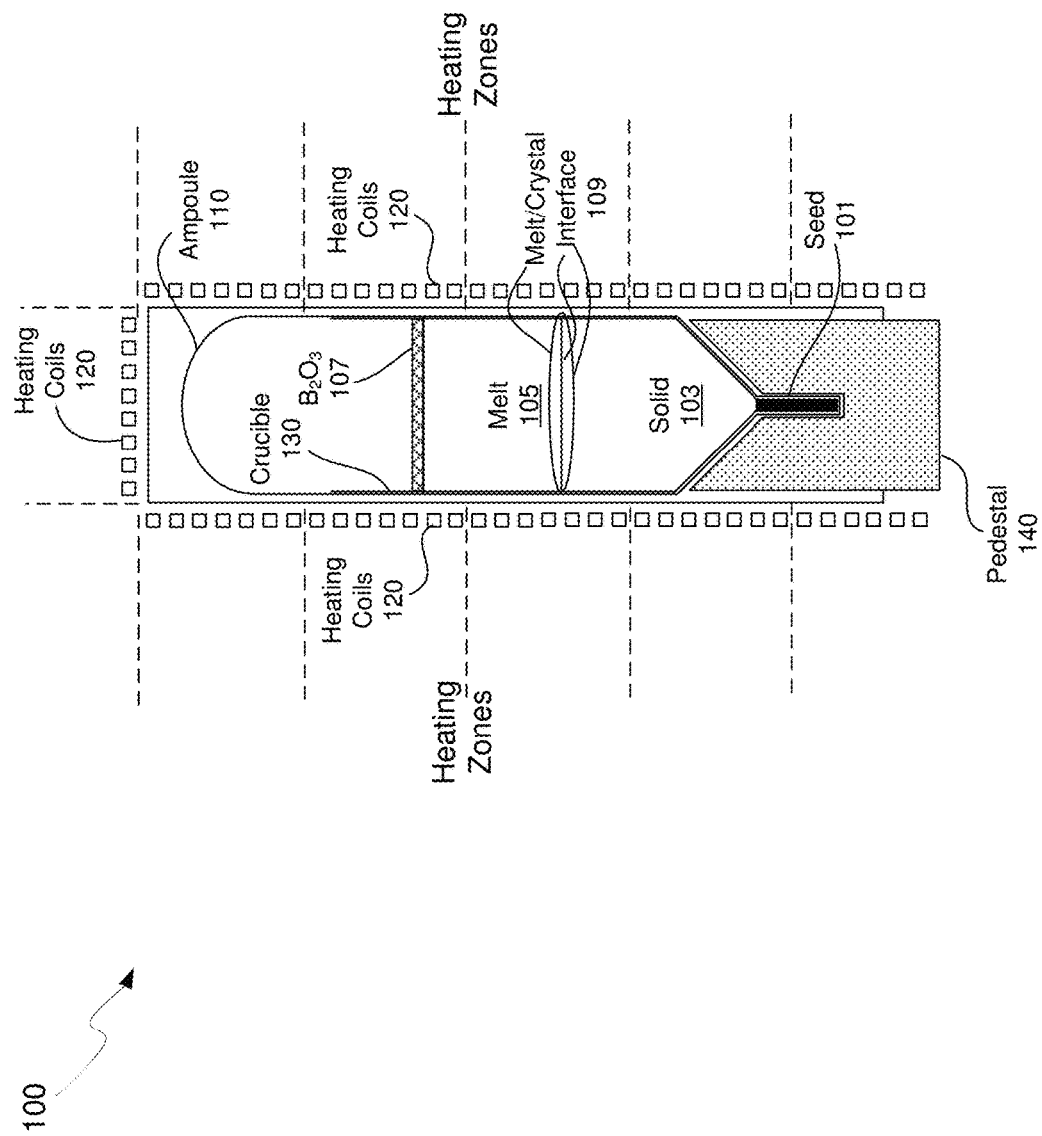
FIG. 1 is a diagram illustrating a vertical gradient freeze reactor, in accordance with an example embodiment of the disclosure.

FIG. 1 is a diagram illustrating a vertical gradient freeze reactor, in accordance with an example embodiment of the disclosure. Referring to FIG. 1, there is shown vertical gradient freeze (VGF) system 100 comprising an ampoule 110, heating coils 120, crucible 130, and pedestal 140. Within the ampoule 110, growth may proceed using a seed crystal 101 and a liquid melt 105 in a vertical configuration, where the solid 103 forms due to very gradual cooling of the melt 105 with a boron trioxide $B_2O_3$ layer as an encapsulant on the melt 105. The crucible 130 may comprise pyrolytic boron nitride (PBN), for example, and may contain the melt and seed materials during the process.

The VGF system 100 comprises a configuration for growth charge, heater, insulation and pedestal 140 that includes: direct radiation from heating coils 120 above the level of cone in the crystal growth charge, the seed 101, and may also comprise a pedestal 140 for support of the ampoule 110 in the heating coils 120. In addition, insulation may be placed within the pedestal 140 to promote radial heat flux inward during growth and heat removal during post-growth process and cooling. The pedestal 140 for the growth ampoule 110 may comprise a hollow core below the seed pocket holding the seed crystal 101 to provide a conducting heat flow path downward through the center and further aided and made more stable by a larger diameter quartz rod down to the bottom of the heater. The pedestal 140 may be operable to move vertically to assist in the growth process, or remain at a fixed height. In addition, the pedestal 140 may rotate to provide further thermal uniformity during heating.

In the VGF process, a polycrystal charge, the seed 101, in crucible 130 in the ampoule 110 may be heated with a multi-zone furnace, as represented by the heating coils 120. In an example scenario, a $B_2O_3$ encapsulant 107 may be placed on top of the melt to reduce loss of crystal growth material, particularly arsenic with higher vapor pressure. Crystal growth is initiated by melting the charge to the seed 101, thereby forming the melt 105, and slowly reducing the temperature to cool the melt 105 at the seed 101. The crystallization process, forming the solid 103, may be precisely controlled by varying the temperature gradient in different zones of the furnace, such as by applying different currents to different portions of the heating coils 120 and/or moving the pedestal 140 vertically. In addition, the pedestal 140 may rotate during heating and cooling to average out any thermal variations within the heating coils 120. Accordingly, the heating coils 120 may comprise a multi-zone heating system where different temperatures, heating/cooling rates, and spatial temperature profiles are enabled.

The VGF process has several advantages over other processes such as liquid encapsulated Czochralski (LEC) and horizontal Bridgman (HB). First, the thermal environment of the crystal and melt are radially symmetric, enabling a radially uniform interface and precise control of temperature profiles. Second, growth in low axial and radial temperature gradients, combined with diameter control imposed by a crucible, and no need to use a large temperature gradient to freeze the crystal quickly, significantly reduces the strain and, hence, dislocations in the crystals. Third, the liquid-solid interface progresses upward through the melt, with crystallization starting at the seed 101 in the bottom of the crucible 130. The system 100 may be cooler at the bottom, and thermally stabilized against convection. Even in the cooling process, easily adjustable cooling brings the crystal to room temperature at a rate that minimizes strain on the crystal.

Before crystal growth, the GaAs polycrystal may be prefabricated by poly synthesis. The poly synthesis process may be performed in a quartz reactor tube utilizing a boat method, for example. Once the polycrystalline GaAs is generated, VGF crystal growth may proceed. To achieve low etch pit density (EPD), several VGF parameters may be carefully controlled. The first parameter may include the shape of the melt/crystal interface 109, which may be controlled to be concave to the melt, for example, being 5-20 mm concave with the center being 5-20 mm lower than the edge of the 8 inch diameter crystal. This may be controlled with different temporal and/or spatial temperature profiles.

Second, the crystallization velocity as controlled by the cooling rate may be configured to a range from 0.1-1.0 degrees C./hour. Different solidification rates at different parts of the ingot may be configured. The temperature gradient along the growing crystal can create stress in the boule, where the head cools earlier and in some instances could have the head ~100 degrees cooler than the tail, so precise control is desirable.

Finally, the temperature gradient at the melt/crystal interface may be configured to be between 1-10 degree C./cm. Again, multi-zone heating may enable precise control of the temperature throughout the crucible 130. After completing the overall solidification, the temperature of the heating may be lowered to room temperature at the speed of about 0.5-5 degrees C./hour, 1-20 degrees C./hour, and 5-20 degrees C./hour, in different heating zones, respectively. This process results in a low-dislocation 8 inch diameter GaAs single crystal of at least 90 mm in length, with a cylindrical body portion. The wafers described here are doped n-type, although p-type and semi-insulating wafers are also enabled by this process. While the process is described for 8 inch diameter ingots, the same process may be used for other diameters (e.g., smaller or larger than 8 inches), with different furnace size. The dislocation density resulting from this process is less than less than 1000 $cm^{-2}$, less than 500 $cm^{-2}$, less than 200 $cm^{-2}$, less than 100 $cm^{-2}$, and even less than 30 $cm^{-2}$, as shown in FIGS. 3A-3D.

In the furnace design shown in FIG. 1, a specific material combination may be selected for the pedestal 140, so that the crystal ampoule 110 can adjust its position in the furnace according to the growth needs, so as to make the crystal in the desired growth position. The pedestal may move vertically, thereby enabling growth of crystals by vertical Bridgman (VB) method, and also may rotate to improve thermal uniformity in the VGF system 100. The pedestal 140 and heating coils 120 enable high quality crystal growth along the longitudinal direction. In one example, the crystal loading weight may be greater than 20 kg, and the effective 8-inch crystal length may be 90 mm or higher. This furnace layout enables a VGF process that accurately configures heat transfer and thermal gradients during growth and cooling to maintain appropriate pressure inside the ampoule 110.

The VGF process disclosed here enables low defect density crystals due to the low thermal gradients that may be maintained during growth. However, even with low gradients, a certain thermal gradient is needed at the solid-liquid interface 109 to maintain continued crystal growth through the entire growth process, and melt temperatures can be high enough to result in high pressures within the ampoule 110. These higher pressures may be more detrimental as ingot diameters increase, causing deformation of the ampoule 110 itself, which in turn may result in possible deviations from stoichiometry as well as damage to the crystal, crucible, and/or ampoule. To avoid these issues, a multi-zone heating configuration may be utilized, with heat input from the sides and top of the ampoule 110/crucible 130, with example heating zones shown by the dashed lines in FIG. 1. In this manner, suitable thermal gradients may be maintained at the growth interface 109 for high quality single crystal growth while still maintaining melt temperatures low enough to reduce and/or eliminate ampoule deformation and resulting issues. In addition, the pedestal 140 enables effective axial heat transfer thereby facilitating single-crystal growth for larger diameters.

Figure 2:
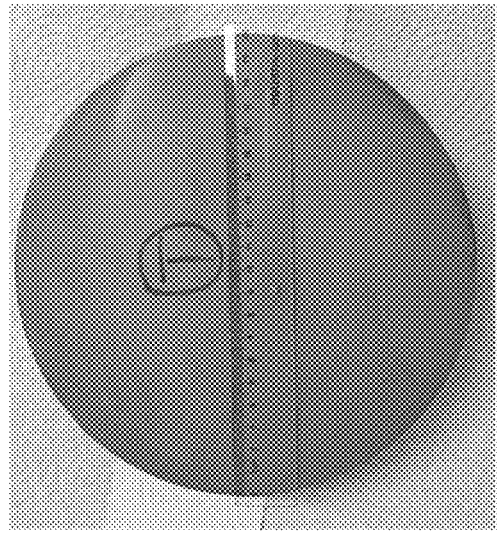
FIG. 2 illustrates an 8 inch GaAs ingot and head and tail end faces of the ingot, in accordance with an example embodiment of the disclosure.
Figure 2:
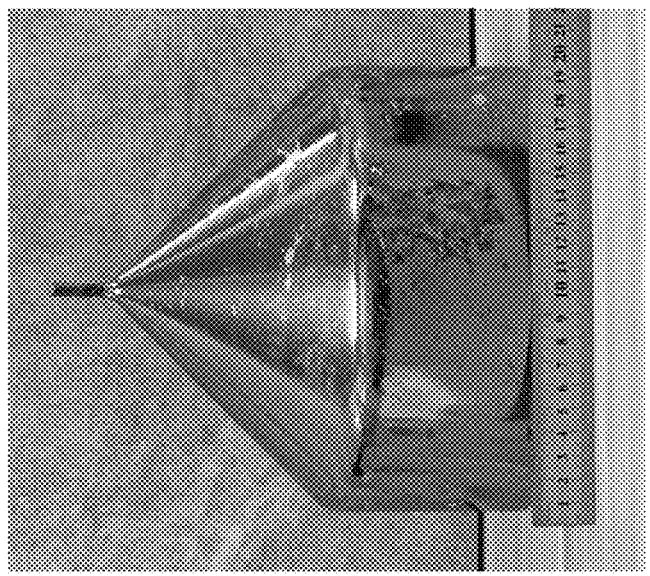
Figure 2:
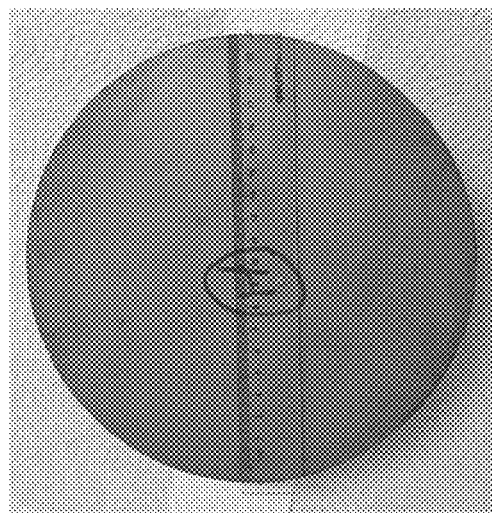

FIG. 2 illustrates an 8 inch GaAs ingot and head and tail end faces of the ingot, in accordance with an example embodiment of the disclosure. Referring to the top image, an 8 inch GaAs ingot, or boule, is shown with a length of more than 90 mm, while the lower images show unpolished head-end and tail-end faces of the ingot, showing the diameter uniformity and lack of macroscopic defects such as twins or grain boundaries for the length of the ingot. In instances where there is vertical movement of the pedestal 140, the furnace design may be "VB-like", enabling longer crystals with low EPD, where even with movement and VB-like configuration, the crystals may have lower EPD by appropriate design of temperature profiles, gradients and ramp rates during growth.

The pedestal 140 may move up and down in the vertical direction. First, when the ampoule is set, the position of the ampoule in the heating zone may be adjusted at any time, so that the crystal is in the best temperature field position. Accordingly, this combination method of VGF+VB enables the growth of longer crystals. Compared with the static crucible 130/ampoule 110, this approach does not necessarily lead to a higher EPD. The VB+VGF provides an excellent method for growing high-quality, low-dislocation, large-size GaAs crystals.

Figure 3A:
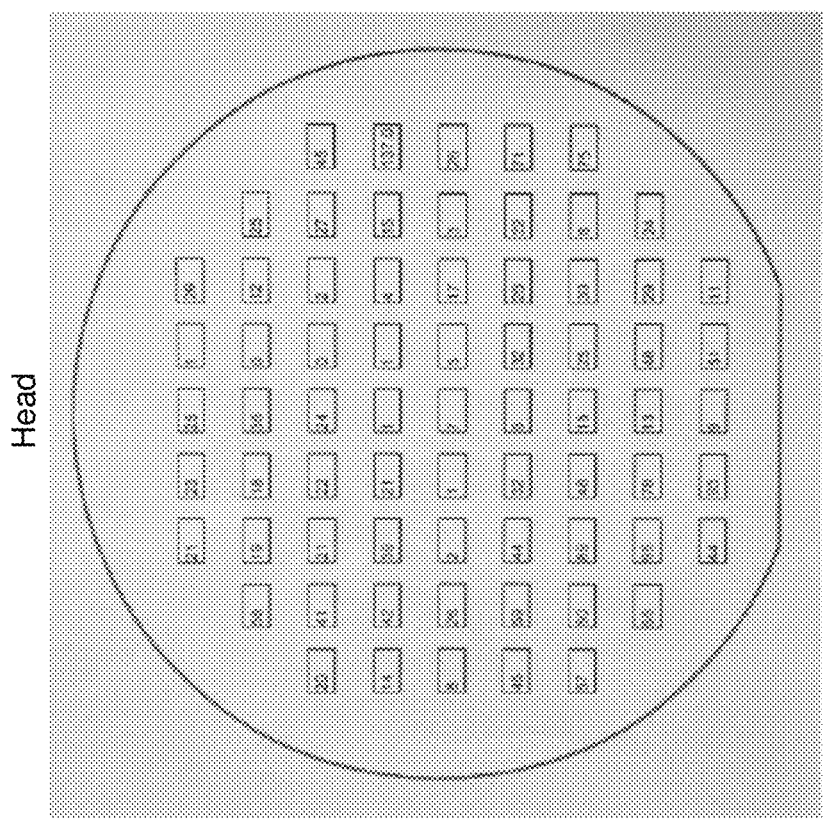
FIGS. 3A-3D illustrate etch pit density results for 8 inch gallium arsenide wafers manufactured in accordance with an embodiment of the disclosure.
Figure 3A:
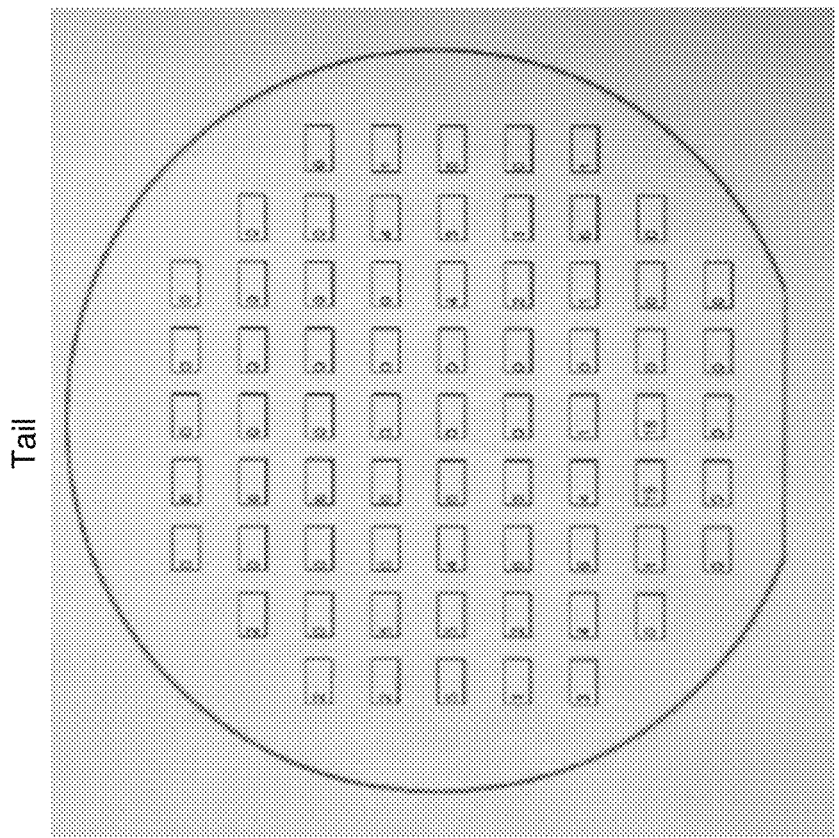

FIGS. 3A-3D illustrate etch pit density results for 8 inch gallium arsenide wafers manufactured in accordance with an embodiment of the disclosure. The EPD measurements may be performed in accordance with SEMI M36-0699 and ASTM Test Method F140-92. FIG. 3A shows EPD results for head-end and tail-end wafers from a first 8 inch ingot, with EPD levels as measured at 69 points (each point having an area of cm 2), with results for the seed (head) and tail ends of the crystal. For this ingot, the wafers show an average EPD of 1288 $cm^{-2}$ at the head end and 71 $cm^{-2}$ at the tail end of the ingot. This is significantly improved over existing GaAs substrates.

Figure 3B:
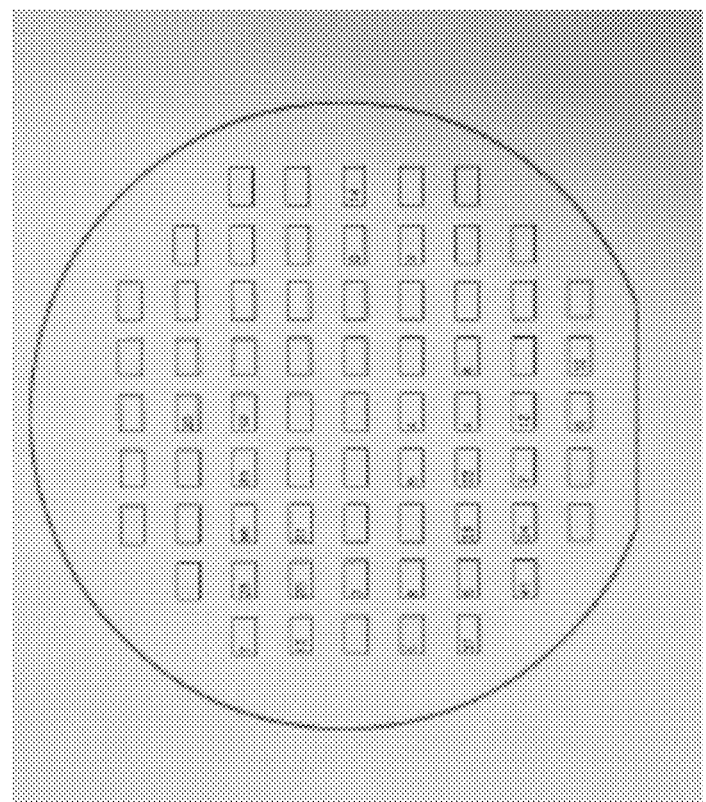

FIG. 3B shows EPD results for head-end and tail-end wafers from a second ingot, with an EPD of 289 $cm^{-2}$ at the head end and 100 $cm^{-2}$ at the tail end, showing the very high quality of the 8 inch GaAs substrates. Hall measurements for the wafers in FIG. 3B resulted in carrier concentrations ranging from $3 \times 10^{17}$ $cm^{-3}$ at the head end to $4 \times 10^{18}$ $cm^{-3}$ at the tail end with resistivity ranging from $5 \times 10^{-3}$ Ω-cm at the head end to $2 \times 10^{-3}$ Ω-cm at the tail end. Finally, Hall mobility ranged from 3000 cm 2/V-sec at the head end to 2000 cm 2/V-sec at the tail end.

Figure 3C:
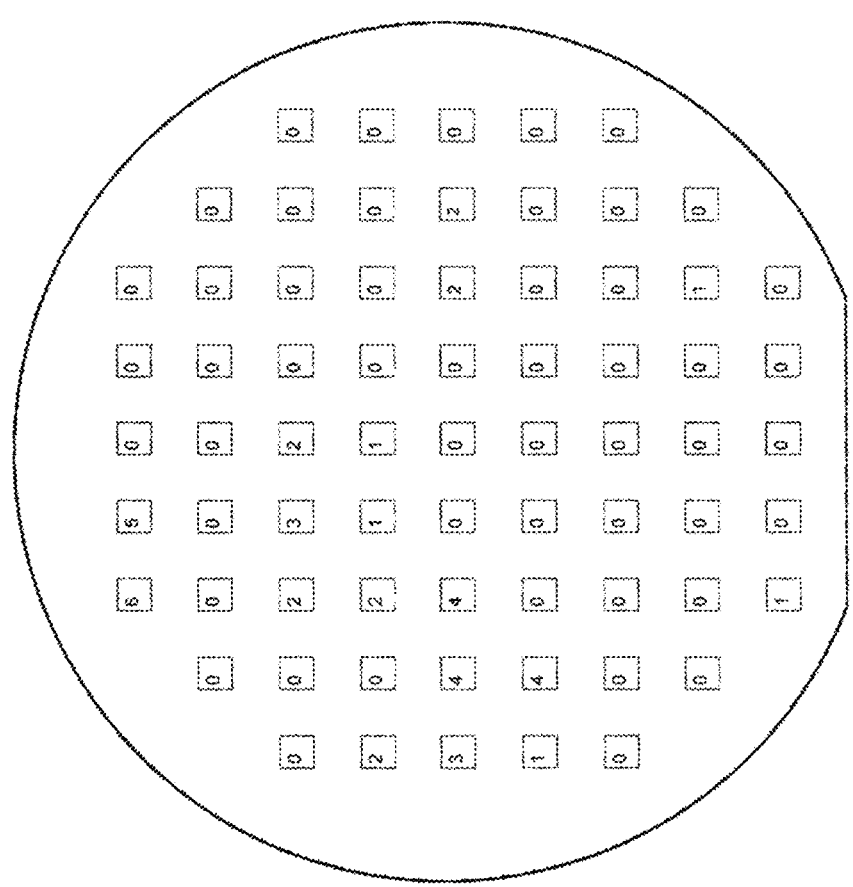

FIG. 3C shows EPD results for a tail-end wafer (No. 47 of a third boule), where the average EPD is 28 $cm^{-2}$ and max EPD is 250 cm$^{-2}$. Non-contact electrical measurements of this boule showed a carrier concentration ranging from $6\times10^{17}$ cm$^{-3}$ at the head end to $1.8\times10^{18}$ cm$^{-3}$ at the tail end with resistivity ranging from $3.4\times10^{-3}$ Ω-cm at the head end to $1.7\times10^{-3}$ Ω-cm at the tail end. Finally, Hall mobility ranged from 2600 cm 2/V-sec at the head end to 2000 cm 2/V-sec at the tail end.

Figure 3D:
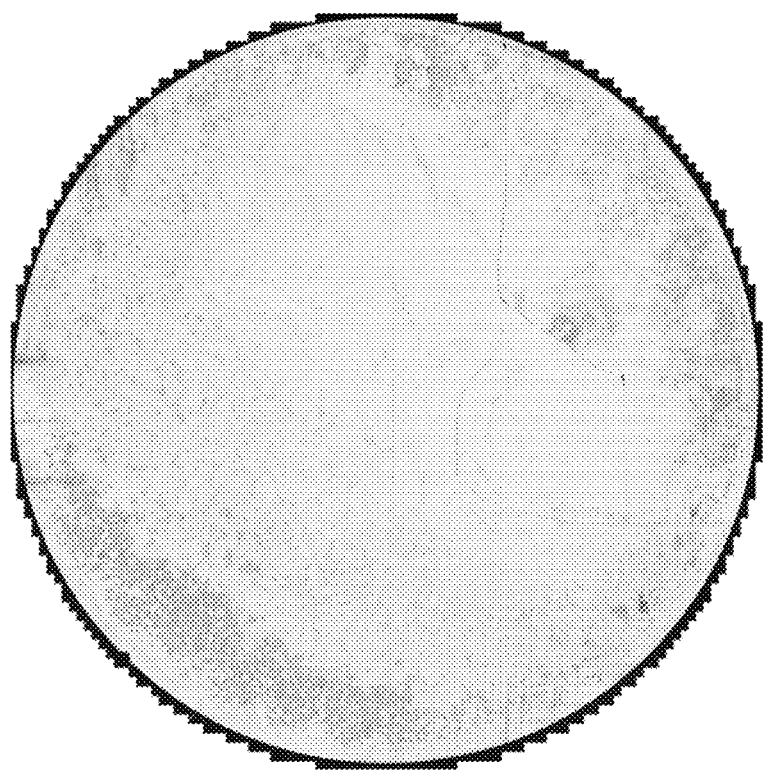
Figure 3D:
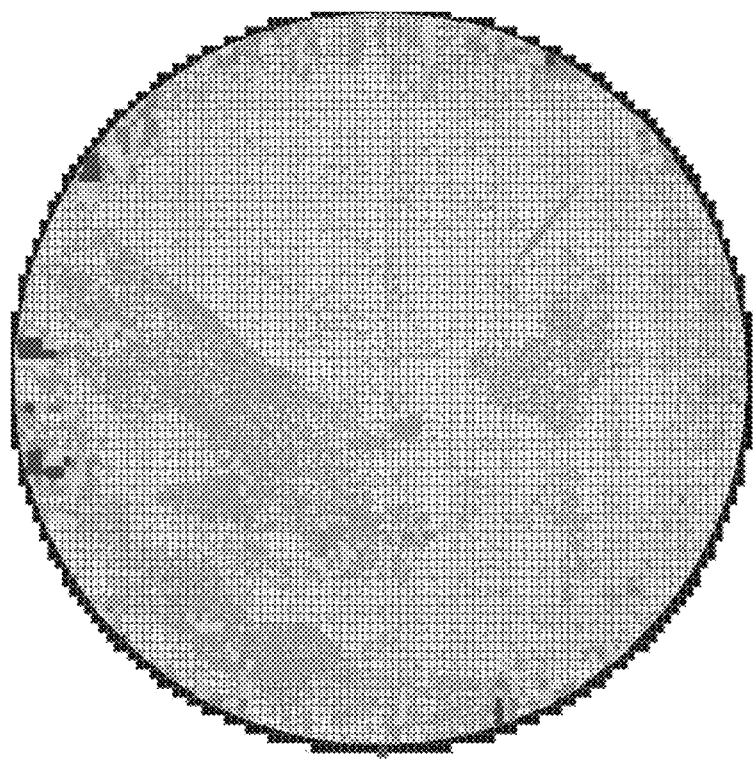
Figures 4A, 4B, 4C, 4D, 4E, 4F:
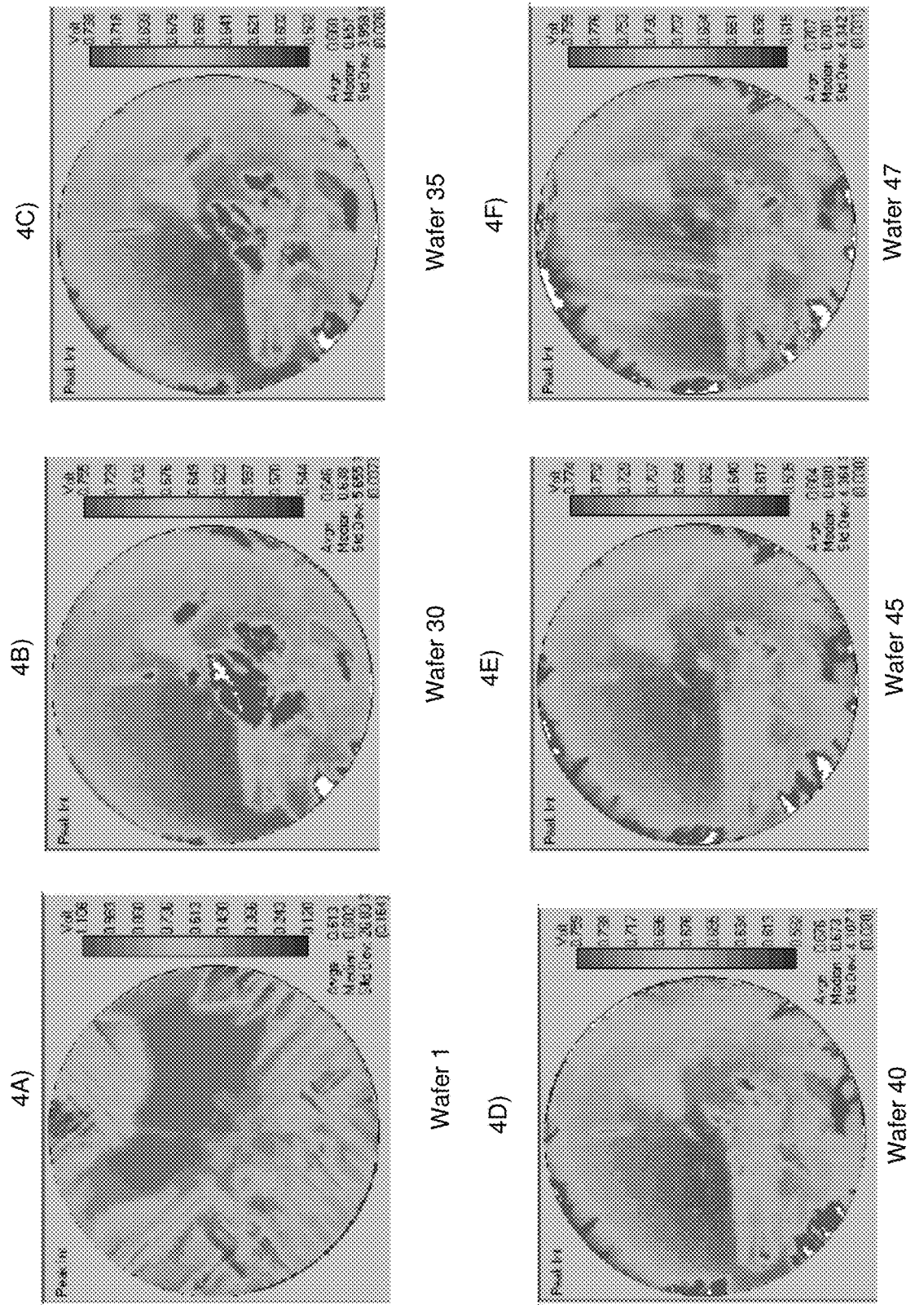
FIGS. 4A-4F illustrate photoluminescence measurements of 8 inch gallium arsenide substrates, in accordance with an example embodiment of the disclosure.

FIG. 3D illustrates and EPD map and image from an nSpec measurement tool of the wafer of FIG. 3C (No. 47 of the third boule), where the EPD was 112 cm$^{-2}$ with percentage of wafer with zero EPD was ~50% and the area percentage with <1000 cm$^{-2}$ is 97%. The image on the right in FIG. 3D shows an optical image of the wafer. The nSpec tool measures the entire surface of the wafer as opposed to the EPD map of FIG. 3C, which is a 69 point measurement.

FIGS. 4A-4F illustrate photoluminescence measurements of 8 inch gallium arsenide substrates, in accordance with an example embodiment of the disclosure. Referring to FIGS. 4A-4F, PL intensity maps for different wafers along an 8 inch diameter GaAs boule are shown, showing results for wafers 1, 30, 35, 40, 45, and 47 of the boule.

In the first ~10 wafers of the boule, higher intensity signals are evident in four regions situated along 3:00, 6:00, 9:00, and 12:00 o'clock positions around the wafer. This increased intensity may be related to dislocations in these regions at the head-end of the boule. The intensity variation standard deviation is ~20% at the head end, while beyond wafers ~15-20, the intensity variation is reduced to ~4%.

FIGS. 5A-F illustrate resistivity maps of 8 inch gallium arsenide substrates, in accordance with an example embodiment of the disclosure. High and low values are included in the maps with resistivity values in mΩ-cm and resistivity variation across each wafer standard deviations are shown below each map.

Figures 5A, 5B, 5C:
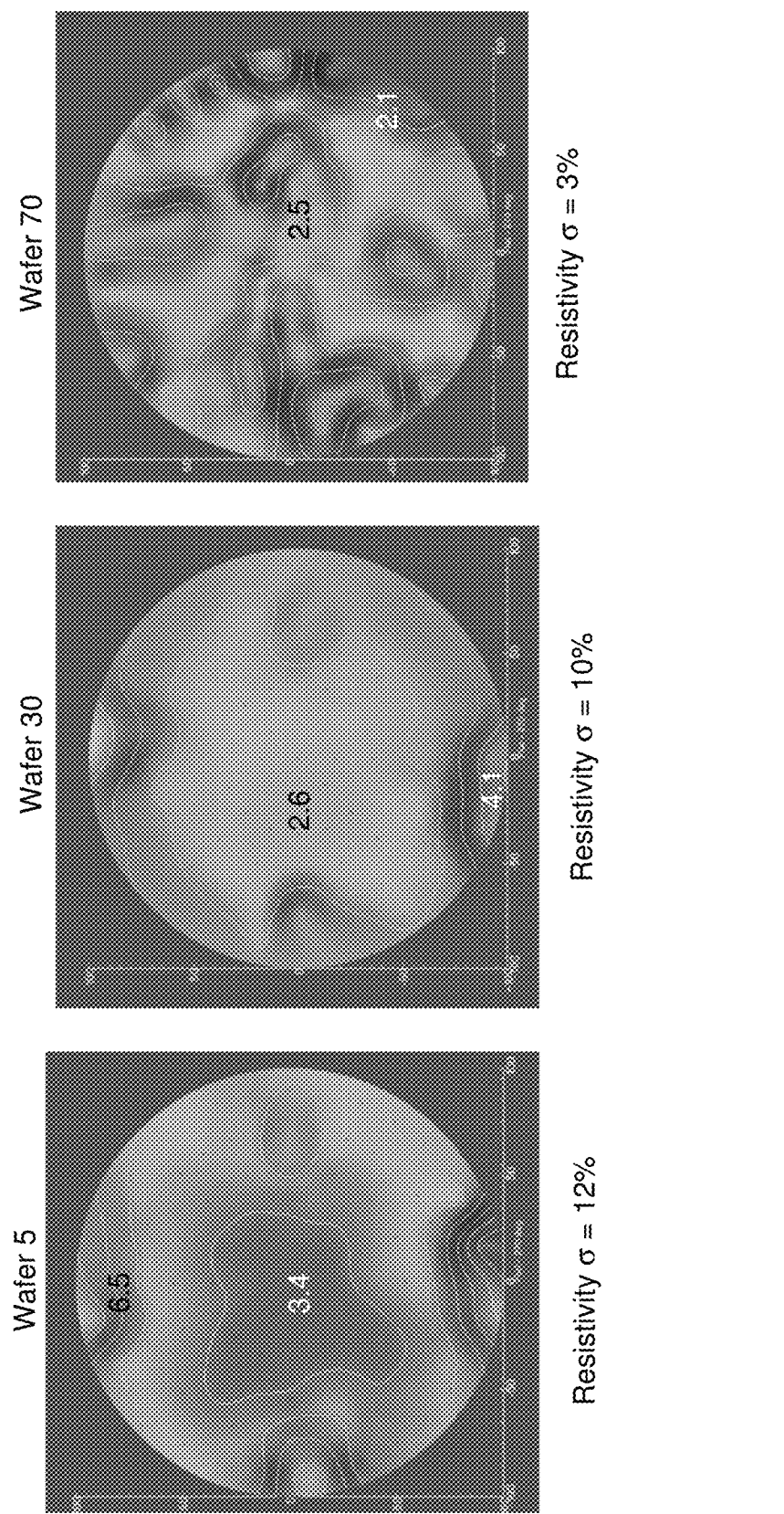
FIGS. 5A-5F illustrate resistivity maps of 8 inch gallium arsenide substrates, in accordance with an example embodiment of the disclosure.

FIGS. 5A-5C show resistivity plots for three 8 inch GaAs wafers from a boule, where the plots show higher resistivity in the 3:00, 6:00, 9:00, and 12:00 positions around the wafer for the head-end wafers, similar to the PL results of FIGS. 4A-4J. As with PL intensity, the resistivity variation decreases towards the tail end of the boule, with 12% variation, or 3.4-6.5 mΩ-cm, at wafer 5, and 3%, or 2.1-2.5 mΩ-cm, at wafer 70.

Figures 5D, 5E, 5F:
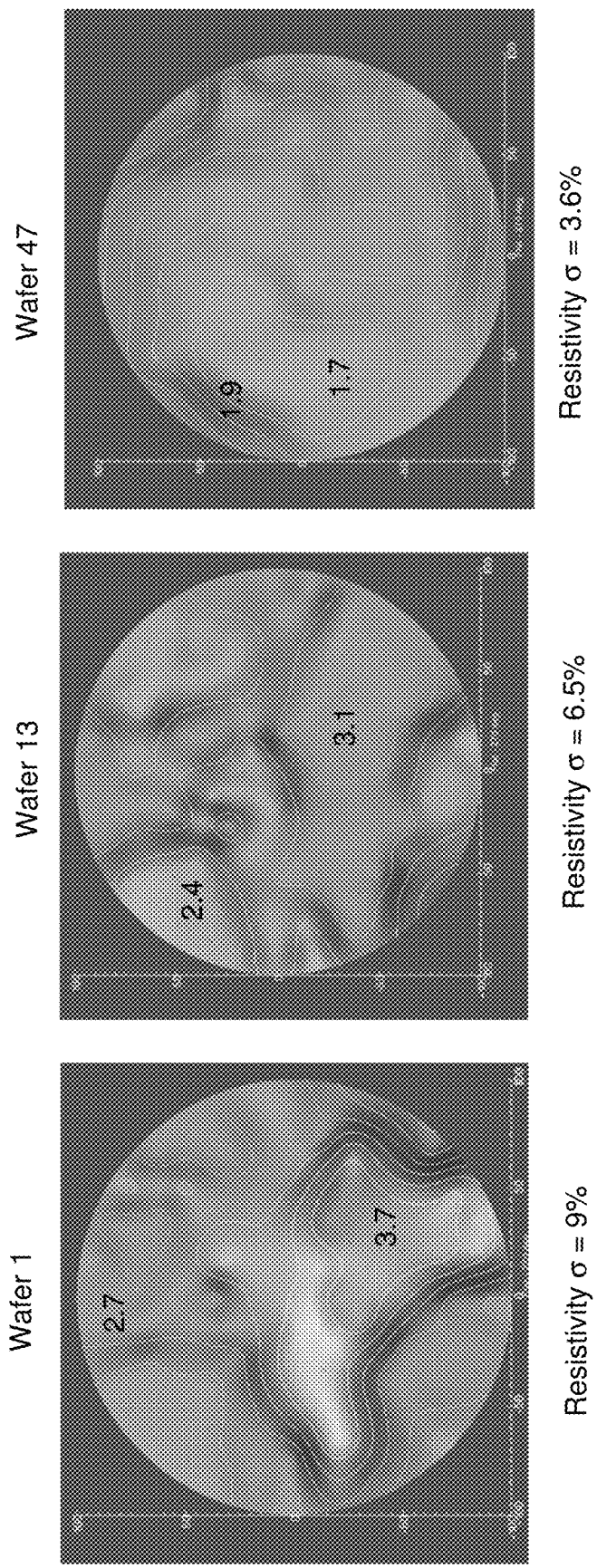

FIGS. 5D-5F show resistivity for three 8 inch wafers from the another boule, where the resistivity variation again decreases for wafers closer to the tail-end of the boule. High and low values are shown in the maps ranging from 2.7 to 3.7 mΩ-cm at the head end and 1.7-1.9 mΩ-cm at the tail end, corresponding to a variation standard deviation shown below each, ranging from 9% for wafer 1 to 3.6% for wafer 47.

Figure 6:
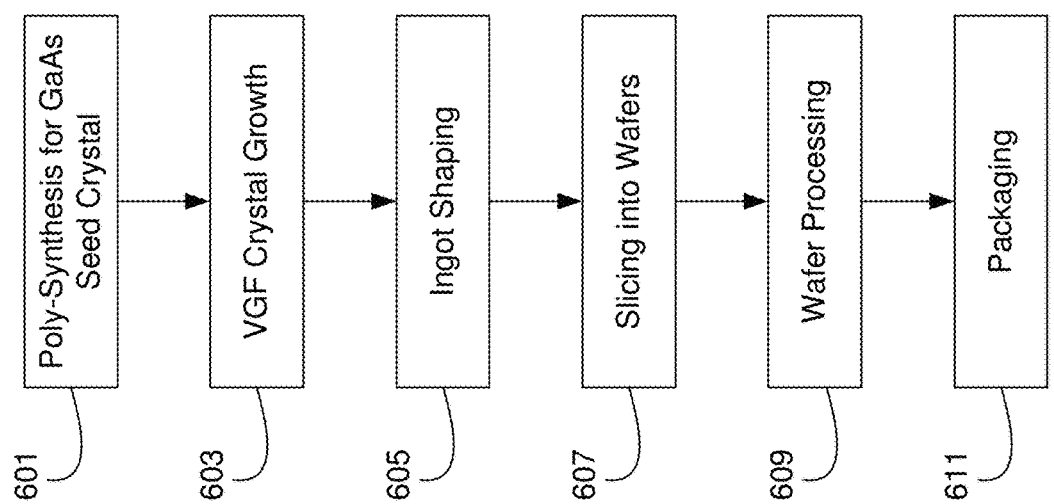
FIG. 6 illustrates a method for fabricating GaAs wafers using the vertical gradient freeze furnace 100 shown in FIG. 1.

FIG. 6 illustrates a method for fabricating GaAs wafers using the vertical gradient freeze furnace 100 shown in FIG. 1. The process results in 8 inch GaAs substrates with average etch pit densities of less than 1000 cm$^{-2}$, less than 500 cm$^{-2}$, less than 100 cm$^{-2}$, and less than 30 cm$^{-2}$ etch pit density. This process may also be used to fabricate indium phosphide (InP), gallium phosphide (GaP) or other related III-V compound semiconductors.

In step 601, raw arsenic (As), gallium (Ga) and a dopant may be obtained and testing may be performed on the raw materials before being placed in a boat in a quartz tube for poly synthesis to produce doped or undoped polycrystalline GaAs. In some examples, the dopant is silicon. In some examples, the dopant includes one or more types of dopant. In some examples, the dopant is optional. A charge is then prepared by placing the polycrystalline GaAs prefabricated by poly-synthesis in a crucible along with a seed crystal, appropriate amount of B$_2$O$_3$ encapsulant, appropriate amount of dopant, evacuating and sealing the crucible inside a fused quartz ampoule.

Once the GaAs charge is generated, vertical gradient freeze (VGF) crystal growth occurs in step 603 where the ampoule with the crucible is heated inside a multi-zone heating system in a controlled manner to progressively melt the polycrystalline charge material containing an optional dopant from the top down until a portion of the seed crystal is melted. Growth may be started from the partially melted seed by implementing a controlled cooling of the multi-zone heater. The temporal and spatial temperature profiles are closely controlled to result low-EPD 8 inch or greater diameter crystals.

To achieve low EPD, several VGF parameters are carefully controlled. The first parameter may include the shape of the melt/crystal interface, which may be controlled to be concave to the melt, for example, being 5-15 mm concave with the center being 5-15 mm lower than the edge of the 8 inch diameter solidified crystal. This may be controlled with different temporal and/or spatial temperature profiles. Second, the crystallization velocity as controlled by the cooling rate may be configured to range from degrees C./hour for different parts of the ingot, while applying a temperature gradient of between 1 and 8 C/cm at the melt-crystal interface. The interface shape may be controlled to be slightly concave to the melt by using appropriate cooling rates in the multi-zone heating system. Different solidification rates at different parts of the ingot may be configured. Finally, the temperature gradient at the melt/crystal interface may be configured to be between 4-8 degree C./cm. Following completion of solidification of the charge material, applying a controlled cooling with appropriate cooling rates of 0.5-5 C/h, 1-10 C/h and 5-20 C/h for different heating zones for the first 300 C, and then at rates of C/h to room temperature may result in very low defect density crystal.

Once the VGF crystals are grown (and optionally tested), in step 605, an ingot shaping process may be conducted to result in a rounded ingot with desired flats, for example, and may also be tested. Once the ingot is shaped, the ingot may be sliced into wafers in step 607, and the wafers may be optionally tested.

Once the low EPD wafers have been sliced from the ingot, the wafers may proceed to wafer processing step 609. An optional wafer annealing process may be performed. In an example annealing process, one or more annealing stages may be used, where the wafers may be loaded vertically into a horizontal quartz boat and inserted in a horizontal quartz ampoule along with arsenic lumps. The arsenic lumps may be configured to provide the needed vapor pressure at the annealing temperature to avoid any arsenic dissociation from the GaAs substrates. The ampoule is then pumped down to a high vacuum level (<5E$^{-3}$ Torr) and sealed. The ampoule and its contents may then be inserted into a horizontal 3-zone furnace, for example, and the heating of the ampoule and its contents to the desired set (platform) temperature is initiated.

Testing may be performed on the wafers to ensure structural and electrical quality. In an example scenario, structural quality may be assessed by x-ray characterization and etch pit density measurements, where x-ray transmission measurements may be utilized to assess the presence of slip dislocations. Average dislocation etch pit density (EPD) of less than 1000 cm$^{-2}$, less than 500 cm$^{-2}$, less than 200 cm$^{-2}$, less than 100 cm$^{-2}$, and even less than 30 cm$^{-2}$ etch pit density, may result in 8 inch GaAs substrates using the above-described process. Structural and electrical quality may also be assessed by photoluminescence and Hall measurements.

Once the low EPD wafers are annealed and optionally tested, a wafer polishing process may be performed that polishes the low EPD wafers and the polished wafers may again be optionally tested. Once the wafers are polished, they may be cleaned and then proceed to step 611 where they may be packaged for shipping to customers. The above processes may also be used to produce indium phosphide (InP) or other compound semiconductor wafers. As a result of this process, low EPD 8 inch GaAs wafers are produced.

Figure 7:
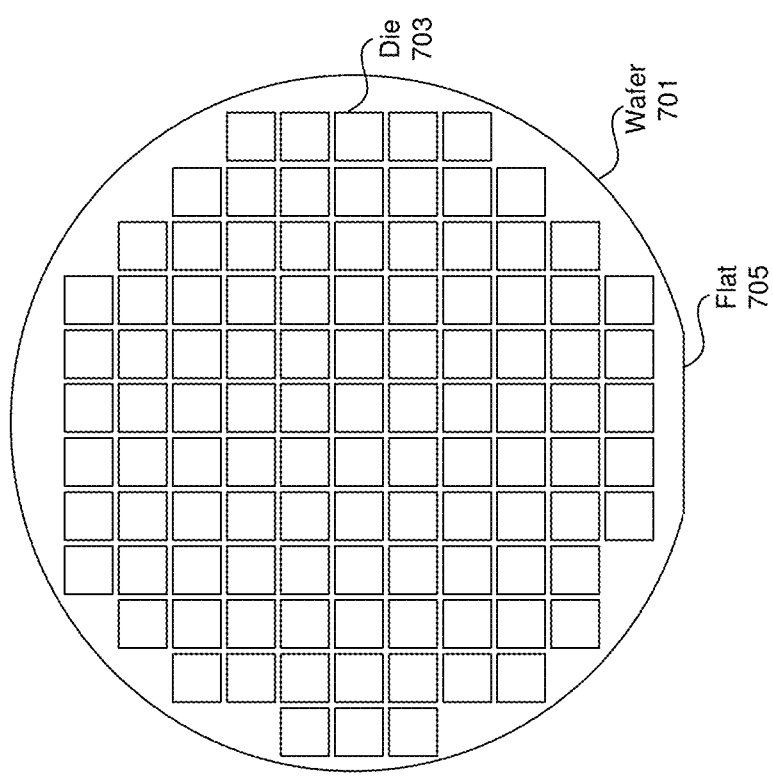
FIG. 7 illustrates devices fabricated on low etch pit density 8 inch gallium arsenide wafers, in accordance with an example embodiment of the disclosure.

FIG. 7 illustrates devices fabricated on low etch pit density 8 inch gallium arsenide wafers, in accordance with an example embodiment of the disclosure. Referring to FIG. 7, there is shown an 8 inch GaAs wafer 701 manufactured using the process described above, and further processed with electrical and/or optoelectronic devices on the die 703. There is also shown a flat 705, which may be formed in wafer fabrication to indicate a crystal plane, for example. In another example scenario, a notch may be utilized instead of a flat. The number of die 703 on the wafer 701 may be defined by the area of each die and the size shown in FIG. 7 is merely an example.

In addition, the die 703 may comprise optoelectronic devices such as edge-emitting lasers, vertical cavity surface-emitting lasers (VCSELS), light-emitting diodes (LEDs) including micro-LEDs, and photodetectors where it may be desired to communicate optical signals through the wafer 701 in some scenarios. For example, an array of detectors or surface emitting lasers may be formed on the wafer 701 and readout or control circuitry may be placed on the devices while the optical signals are received and/or transmitted through the wafer 701.

The process described above may be utilized to fabricate doped substrates, such as silicon-doped substrates, for optoelectronic applications, for example. Silicon, for example, may be incorporated during crystal growth, although other dopants are possible. Dislocations in the substrate can reduce reliability of the devices as current can increase defect size and defects may impact PL, as shown above. In instances where smaller devices are to be fabricated on the substrates, such as micro-LEDs, any defects may comprise a larger area of the device, adversely impacting performance, indicating the advantage of the low EPD crystals disclosed here.

In addition, the process may also be used to generate semi-insulating or low-doped substrates. Semi-insulating GaAs substrates enable high-speed electronic devices due to the high resistivity of the substrates, where conductive substrates can cause losses and parasitic capacitance. Example devices include pseudomorphic high electron mobility transistors (pHEMTs) and heterojunction bipolar transistors.

In an embodiment of the disclosure, wafers for low etch pit density gallium arsenide crystals with silicon dopant (and/or other suitable dopants) may include a gallium arsenide single crystal wafer having an etch pit density of less than 1000 cm$^{-2}$, less than 500 cm$^{-2}$, less than 200 cm$^{-2}$, less than 100 cm$^{-2}$, and even less than 30 cm$^{-2}$. The wafer may have a diameter of 8 inches or greater. The wafer may have a dopant concentration in the range of $3\times10^{17}$ to $4\times10^{18}$ cm$^{-3}$. The wafer may have a thickness of 500 µm or greater. Photoluminescence measurements may result in a peak intensity standard deviation of less than 5%.

In another embodiment of the disclosure, a method for low etch pit density gallium arsenide crystals may include sealing charge material comprising polycrystalline gallium arsenide seed crystal, $B_2O_3$ encapsulant, and carbon in a crucible; sealing the crucible in a quartz ampoule; performing a vertical gradient freeze crystal growth process by heating the ampoule using a multi-zone heating system to progressively melt the charge material until a portion of the seed crystal is melted; starting growth from the partially melted seed by implementing a controlled cooling of the multi-zone heating system; applying a temperature gradient of between 1 and 8 C/cm at a melt-crystal interface; and controlling a shape of the interface to be concave to the melt utilizing cooling rates in the multi-zone heating system to form a solidified gallium arsenide crystal.

The cooling of the multi-zone heating system may be configured at the rate of $0.1^{-2}$ C/h. The crucible may be evacuated before sealing it into the quartz ampoule. The solidified charge material may be cooled at rates of 0.5-5 C/h, 1-10 C/h, and 5-20 C/h for different heating zones for the first 300 C, and then at rates of 20-50 C/h to room temperature. The interface shape may be controlled to be concave to the melt, with the center being 5-15 mm lower than the edge of the solidified crystal. The solidified crystal may have a diameter of 8 inches or more and may have an etch pit density of less than 1000 cm$^{-2}$, less than 500 cm$^{-2}$, less than 200 cm$^{-2}$, less than 100 cm$^{-2}$, and even less than 30 cm$^{-2}$. The wafer may have a diameter of 8 inches or greater. The wafer may have a dopant concentration in the range of $3\times10^{17}$ to $4\times10^{18}$ cm$^{-3}$. The wafer may have a thickness of 500 µm or greater. Photoluminescence measurements may result in a peak intensity standard deviation of less than 5%.

In disclosed examples, a vertical gradient freeze system for forming gallium arsenide (GaAs) 8 inch substrates having silicon as a dopant, the system includes a crucible to contain a GaAs liquid melt and seed material during a formation process; one or more heating coils arranged in a plurality of heating zones; and a pedestal to move relative to the crucible, the system operable to control heating of the plurality of heating zones and movement of the pedestal to form a single crystal GaAs substrate.

In some examples, an ampule supports the crucible. In examples, the pedestal is operable to move the crucible relative to the heating coils. In examples, the pedestal is operable to rotate relative to the heating coils. In examples, the pedestal is operable to move vertically relative to the heating coils.

In some examples, the heating coils are operable to activate or the pedestal is operable to move to control a shape of an interface between the GaAs liquid melt and crystals to achieve low etch pit density (EPD). In examples, the shape is concave to the GaAs liquid melt. In examples, the shape of the interface is between 5-20 mm concave, such that the center is 5-20 mm lower than an edge of the substrate.

In some examples, a boron trioxide $B_2O_3$ layer is placed as an encapsulant on the GaAs liquid melt to reduce loss of crystal growth material. In examples, the heating coils are operable to activate or the pedestal is operable to move to control a crystallization velocity as controlled by the cooling rate may be configured to a range from degrees C./hour.

In some examples, the heating coils are operable to activate or the pedestal is operable to move to control a temperature gradient at the GaAs liquid melt/crystal interface may be configured to be between 1-10 degree C./cm.

In examples, insulation is placed on or within the pedestal to promote radial heat flux inward during growth or heat removal during post-growth process and cooling.

In some examples, one or more electronic or optoelectronic devices are formed on a first surface of the surface. In examples, the electronic or optoelectronic devices are one or more of a light-emitting diodes (LEDs), lasers, heterojunction bipolar transistors (HBTs), and pseudo-morphic high-electron mobility transistors (pHEMTs). In examples, the substrate is diced into a plurality of die, such that optical signals from an optoelectronic device of the electronic or optoelectronic devices on a first side of the substrate are communicated out a second side of the substrate opposite to the first side.

In some examples, the substrate has an etch pit density of less than 200 $cm^{-2}$. In examples, the substrate has a dopant concentration of $1\times10^{19}$ $cm^{-3}$ or greater. In examples, the substrate has a thickness of 300 μm or greater.

In some disclosed examples, method for forming single crystal gallium arsenide substrates, the method including sealing charge material comprising polycrystalline gallium arsenide (GaAs) seed crystal, $B_2O_3$ encapsulant, and carbon in a crucible; sealing the crucible in a quartz ampoule; performing a vertical gradient freeze crystal growth process by heating the ampoule using a multi-zone heating system to progressively melt the charge material until a portion of the seed crystal is melted; moving a pedestal relative to the crucible, the system operable to control heating of the multi-zone heating system and movement of the pedestal; and implementing controlled cooling of the multi-zone heating system during growth from the partially melted seed to form a single crystal GaAs substrate 8 inch.

In some examples, the method further includes applying a temperature gradient of between 1 and 8 C/cm at a melt-crystal interface.

In some examples, the method further includes controlling a shape of the interface to be concave to the melt utilizing cooling rates in the multi-zone heating system to form a solidified gallium arsenide crystal. In some examples, the shape of the interface is between 5-20 mm concave, such that the center is 5-20 mm lower than an edge of the substrate.

In some examples, moving the pedestal includes moving the crucible relative to the multi-zone heating system. In some examples, moving the pedestal includes rotates the crucible relative to the multi-zone heating system. In examples, moving the pedestal includes moving the crucible vertically relative to the multi-zone heating system.

In some examples, the method further includes controlling the multi-zone heating system or the pedestal movement to control a crystallization velocity as controlled by the cooling rate may be configured to a range from 0.1-2.0 degrees C./hour.

In some examples, the method further includes forming one or more electronic or optoelectronic devices on a first surface of the substrate. In some examples, the electronic or optoelectronic devices are one or more of a light-emitting diodes (LEDs), lasers, heterojunction bipolar transistors (HBTs), and pseudo-morphic high-electron mobility transistors (pHEMTs).

In some examples, the method further includes evacuating the crucible before sealing it into the quartz ampoule. In examples, the method further includes cooling the solidified charge material at rates of 0.5 to 5 C/h, 1 to 10 C/h and 5 to 20 C/h for different heating zones of the multi-zone heating system for the first 300 C, and then at rates of 20-50 C/h to room temperature.

While the invention has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method for forming single crystal gallium arsenide substrates, the method comprising:
    sealing charge material comprising polycrystalline gallium arsenide (GaAs) liquid melt, $B_2O_3$ encapsulant, and carbon in a crucible;
    sealing the crucible in a quartz ampoule;
    performing a vertical gradient freeze crystal growth process by heating the ampoule using a multi-zone heating system to progressively melt the charge material until a portion of a seed crystal is melted, wherein each zone of the multi-zone heating system is enabled to heat the crucible at different temperatures, and wherein each zone of the multi-zone heating system includes two or more heating coils;
    moving a pedestal relative to the crucible through three or more zones of the multi-zone heating system, the system operable to control heating of the multi-zone heating system and movement of the pedestal;
    implementing controlled cooling of the multi-zone heating system during growth from the partially melted seed to form a single crystal 8 inch GaAs substrate; and
    controlling a shape of the interface to be concave to the melt utilizing cooling rates in the multi-zone heating system to form a solidified gallium arsenide crystal, wherein the shape of the interface is concave, such that the center is 5-20 mm lower than an edge of the substrate.

2. The method according to claim 1, further comprising applying a temperature gradient of between 1 and 8 C/cm at a melt-crystal interface.

3. The method according to claim 1, wherein moving the pedestal moves the crucible relative to the multi-zone heating system.

4. The method according to claim 1, wherein moving the pedestal rotates the crucible relative to the multi-zone heating system.

5. The method according to claim 1, wherein moving the pedestal moves the crucible vertically relative to the multi-zone heating system.

6. The method according to claim 1, further comprising controlling the multi-zone heating system or the pedestal movement to control a crystallization velocity as controlled by the cooling rate may be configured to a range from 0.1-2.0 degrees C./hour.

7. The method according to claim 1, further comprising forming one or more electronic or optoelectronic devices on a first surface of the substrate.

8. The method according to claim 7, wherein the electronic or optoelectronic devices are one or more of a light-emitting diodes (LEDs), lasers, heterojunction bipolar transistors (HBTs), and pseudo-morphic high-electron mobility transistors (pHEMTs).

9. The method according to claim 1, comprising evacuating the crucible before sealing it into the quartz ampoule.

10. The method according to claim 1, comprising cooling the solidified charge material at rates of 0.5 to 5 C/h, 1 to 10 C/h and 5 to 20 C/h for different heating zones of the multi-zone heating system for the first 300 C, and then at rates of 20-50 C/h to room temperature, wherein different heating zones are cooling the charge at a different temperature.

11. The method according to claim 1, further comprising varying the temperature gradient in different zones of the multi-zone heating system by applying different currents to different heating coils.

12. A method for forming single crystal gallium arsenide substrates, the method comprising:
- sealing charge material comprising polycrystalline gallium arsenide (GaAs) liquid melt, $B_2O_3$ encapsulant, and carbon in a crucible;
- sealing the crucible in a quartz ampoule;
- performing a vertical gradient freeze crystal growth process by heating the ampoule using a multi-zone heating system to progressively melt the charge material until a portion of a seed crystal is melted;
- moving a pedestal relative to the crucible, the system operable to control heating of the multi-zone heating system and movement of the pedestal; and
- implementing controlled cooling of the multi-zone heating system during growth from the partially melted seed; and
- controlling a shape of the interface to be concave to the melt utilizing cooling rates in the multi-zone heating system to form a solidified gallium arsenide crystal, wherein the shape of the interface is between 5-20 mm concave, such that the center is 5-20 mm lower than an edge of the substrate to form a single crystal 8 inch GaAs substrate.

13. The method according to claim 12, further comprising varying the temperature gradient in different zones of the multi-zone heating system by applying different currents to different heating coils.

14. The method according to claim 12, wherein moving the pedestal moves the crucible relative to the multi-zone heating system.

15. The method according to claim 12, further comprising controlling the multi-zone heating system or the pedestal movement to control a crystallization velocity as controlled by the cooling rate may be configured to a range from 0.1-2.0 degrees C./hour.

16. The method according to claim 12, further comprising forming one or more electronic or optoelectronic devices on a first surface of the substrate.

17. The method according to claim 12, comprising evacuating the crucible before sealing it into the quartz ampoule.

18. The method according to claim 12, comprising cooling the solidified charge material at rates of 0.5 to 5 C/h, 1 to 10 C/h and 5 to 20 C/h for different heating zones of the multi-zone heating system for the first 300 C, and then at rates of 20-50 C/h to room temperature, wherein different heating zones are cooling the charge at a different temperature.

* * * * *